United States Patent
Huang et al.

(10) Patent No.: US 10,923,589 B2
(45) Date of Patent: Feb. 16, 2021

(54) HIGH VOLTAGE DEVICE AND MANUFACTURING METHOD THEREOF

(71) Applicant: RICHTEK TECHNOLOGY CORPORATION, Zhubei (TW)

(72) Inventors: Tsung-Yi Huang, Hsinchu (TW); Kun-Huang Yu, Hsinchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 0 days.

(21) Appl. No.: 16/542,268

(22) Filed: Aug. 15, 2019

(65) Prior Publication Data

US 2020/0105926 A1 Apr. 2, 2020

(30) Foreign Application Priority Data

Sep. 27, 2018 (TW) .................. 10713419.5

(51) Int. Cl.
*H01L 29/78* (2006.01)
*H01L 29/10* (2006.01)
(Continued)

(52) U.S. Cl.
CPC .... *H01L 29/7816* (2013.01); *H01L 21/02271* (2013.01); *H01L 21/02532* (2013.01);
(Continued)

(58) Field of Classification Search
CPC . H01L 29/165; H01L 29/7782; H01L 29/783; H01L 29/1095; H01L 29/78615; H01L 29/456; H01L 29/0878; H01L 29/205; H01L 21/823807; H01L 21/823814; H01L 21/25606; H01L 21/76202; H01L 21/26513; H01L 21/02532
See application file for complete search history.

(56) References Cited

U.S. PATENT DOCUMENTS 5,559,348 A * 9/1996 Watabe ............... H01L 29/0619
257/141
5,698,869 A * 12/1997 Yoshimi ............. H01L 27/1203
257/192
(Continued)

FOREIGN PATENT DOCUMENTS

TW 201338160 A 9/2013

*Primary Examiner* — Caridad Everhart
(74) *Attorney, Agent, or Firm* — Tung & Associates

(57) ABSTRACT

A high voltage device includes: a crystalline silicon layer, a well, a body region, a gate, a source, and a drain. The body region has a P-type conductivity type, and is formed in the well. The gate is located on and in contact with the well. The source and the drain have an N-type conductivity type, and are located below, outside, and at different sides of the gate, and are located in the body region and the well respectively. An inverse region is defined in the body region between the source and the well, to serve as an inverse current channel in an ON operation. The inverse region includes a germanium distribution region which has a germanium atom concentration higher than $1*10^{13}$ atoms/cm$^2$. A drift region is defined in the well, between the body region and the drain, to serve as a drift current channel in an ON operation.

8 Claims, 7 Drawing Sheets

(51) Int. Cl.

| | |
|---|---|
| *H01L 29/08* | (2006.01) |
| *H01L 29/66* | (2006.01) |
| *H01L 29/167* | (2006.01) |
| *H01L 29/36* | (2006.01) |
| *H01L 21/02* | (2006.01) |
| *H01L 21/762* | (2006.01) |
| *H01L 21/265* | (2006.01) |

(52) U.S. Cl.
CPC .. *H01L 21/26506* (2013.01); *H01L 21/26513* (2013.01); *H01L 21/76202* (2013.01); *H01L 21/76224* (2013.01); *H01L 29/0865* (2013.01); *H01L 29/0882* (2013.01); *H01L 29/1095* (2013.01); *H01L 29/167* (2013.01); *H01L 29/36* (2013.01); *H01L 29/66681* (2013.01)

(56) References Cited

U.S. PATENT DOCUMENTS

| | | | |
|---|---|---|---|
| 7,393,752 B2 | 7/2008 | Yang | |
| 2004/0251498 A1* | 12/2004 | Zingg | H01L 29/402 |
| | | | 257/343 |
| 2007/0080389 A1* | 4/2007 | Petruzzello | H01L 29/7817 |
| | | | 257/312 |
| 2018/0366561 A1* | 12/2018 | Dochev | H01L 27/1203 |

\* cited by examiner

HIGH VOLTAGE DEVICE AND MANUFACTURING METHOD THEREOF

CROSS REFERENCES

The present invention claims priority to TW 107134195 filed on Sep. 27, 2018.

BACKGROUND OF THE INVENTION

Field of Invention

The present invention relates to a high voltage device and a manufacturing method thereof; particularly, it relates to such high voltage device and manufacturing method which can reduce the on-resistance of the high voltage device.

Description of Related Art

FIGS. 1A and 1B show schematic diagrams of a cross-section view and a top-view of a prior art high voltage device 100, respectively. In the context of the present invention, a "high voltage" device refers to a device which needs to withstand a voltage over 5V on a drain thereof in normal operation. Typically, the high voltage device 100 has a drift region 12a (as indicated by the dashed frame shown in FIG. 1B) which separates the drain 19 and the body region 16 of the high voltage device 100, wherein a lateral length of the drift region 12a is determined according to the threshold voltage that the high voltage device 100 is designed to operate by. As shown in FIGS. 1A and 1B, the high voltage device 100 includes: a well 12, an isolation region 13, a drift oxide region 14, a body region 16, a body contact 16', a gate 17, a source 18 and a drain 19. The well 12 has a conductivity type of N-type, and is formed on a semiconductor substrate 11. The isolation region 13 is a local oxidation of silicon (LOCOS) structure, for defining a device region 13a which is an active area for an operation of the high voltage device 100. The device region 13a has a range which is indicated by the bold dashed frame in FIG. 1A. The gate 17 overlays a part of the drift oxidation region 14.

The body region 16 includes an inverse region 15 which is defined in the body region 16 between the source 18 and an upper area of the well 12 (as indicated by the oval dashed frame shown in FIG. 1B). The inverse region 15 serves as an inverse current channel when the high voltage device 100 is in an ON operation. Typically, in the inverse region 15, boron atoms doped in the body region 16 serve as P-type impurities to form the inverse current channel when the high voltage device 100 is in an ON operation (i.e. when the gate 17 is applied with an operation voltage), thereby providing a path for a conductive current to flow through. The detail of the above-mentioned mechanism is well known by those skilled in the art, so it is not redundantly explained here. Nevertheless, during a thermal process in manufacturing the high voltage device 100, these boron atoms may diffuse undesirably due to lattice defects. This can cause an undesirable increase of the length of the inverse current channel, to increase the on-resistance.

In view of above, to overcome the drawback in the prior art, the present invention provides a high voltage device which can inhibit the undesirable diffusion of the boron atoms, so as to reduce the on-resistance of the high voltage device.

SUMMARY OF THE INVENTION

From one perspective, the present invention provides a high voltage device comprising: a crystalline silicon layer, which is formed on a semiconductor substrate; a well having an N-type conductivity type, which is formed in the crystalline silicon layer; a body region having a P-type conductivity type, which is formed in the well; a gate, which is located on the well and is in contact with the well; and a source and a drain having the N-type conductivity type, wherein the source and the drain are located below, outside, and at different sides of the gate, and are located in the body region and the well, respectively; wherein an inverse region is defined in the body region, between the source and the well; the inverse region serving as an inverse current channel when the high voltage device is in an ON operation; wherein the inverse region includes a germanium distribution region which has a germanium atom concentration higher than $1*10^{13}$ atoms/cm$^2$; wherein a drift region is defined in the well, between the body region and the drain; the drift region serving as a drift current channel when the high voltage device is in the ON operation; wherein the inverse region further includes a boron distribution region; the germanium distribution region being configured to restrict a diffusion area of the boron distribution region.

From another perspective, the present invention provides a manufacturing method of a high voltage device, comprising: forming a crystalline silicon layer on a semiconductor substrate; forming a well in the crystalline silicon layer, wherein the well has an N-type conductivity type; forming a body region in the well, wherein the body region has a P-type conductivity type; forming a gate on and in contact with the well; and forming a source and a drain having the N-type conductivity type, wherein the source and the drain are located below, outside, and at different sides of the gate, and are located in the body region and the well, respectively; wherein an inverse region is defined in the body region, between the source and the well; the inverse region serving as an inverse current channel when the high voltage device is in an ON operation; wherein the inverse region includes a germanium distribution region which has a germanium atom concentration higher than $1*10^{13}$ atoms/cm$^2$; wherein a drift region is defined in the well, between the body region and the drain; the drift region serving as a drift current channel when the high voltage device is in the ON operation; wherein the inverse region further includes a boron distribution region; the germanium distribution region being configured to restrict a diffusion area of the boron distribution region.

In one embodiment, the high voltage device further comprises: a drift oxide region, which is formed on and in contact with the drift region; wherein at least a part of the drift oxide region is located below and in contact with a part of the gate; wherein the drift oxide region includes a local oxidation of silicon (LOCOS) structure, a shallow trench isolation (STI) structure or a chemical vapor deposition (CVD) oxide structure.

In one embodiment, the high voltage device further comprises: a body contact having the P-type conductivity type, which is formed in the body region, wherein the body contact serves as an electrical contact of the body region.

In one embodiment, the gate includes: a dielectric layer, which is formed on and in contact with the well in a vertical direction; a conductive layer, which is formed on and in contact with the dielectric layer, and serves as an electrical contact of the gate; and a spacer layer, which is formed outside of two sidewalls of the conductive layer, and serves as an electrical insulation layer of the gate.

In one embodiment, the step of forming the body region in the well includes the steps of: implanting a plurality of germanium atoms in the germanium distribution region via a first ion implantation process step, so that the germanium distribution region has an amorphous region; after the plurality of germanium atoms have been implanted in the germanium distribution region, implanting a plurality of boron atoms via a second ion implantation process step, in a part of the well which includes the germanium distribution region; and after the plurality of boron atoms have been implanted in the well, transforming the germanium distribution region to a crystalline region via a thermal annealing process, and forming the body region and the inverse region within the body region.

In one embodiment, the amorphous region has a depth smaller than 0.1 micrometer.

The objectives, technical details, features, and effects of the present invention will be better understood with regard to the detailed description of the embodiments below.

DESCRIPTION OF THE PREFERABLE EMBODIMENTS

The drawings as referred to throughout the description of the present invention are for illustration only, to show the interrelations among the process steps and the layers, while the shapes, thicknesses, and widths are not drawn in actual scale.

Figure 2:
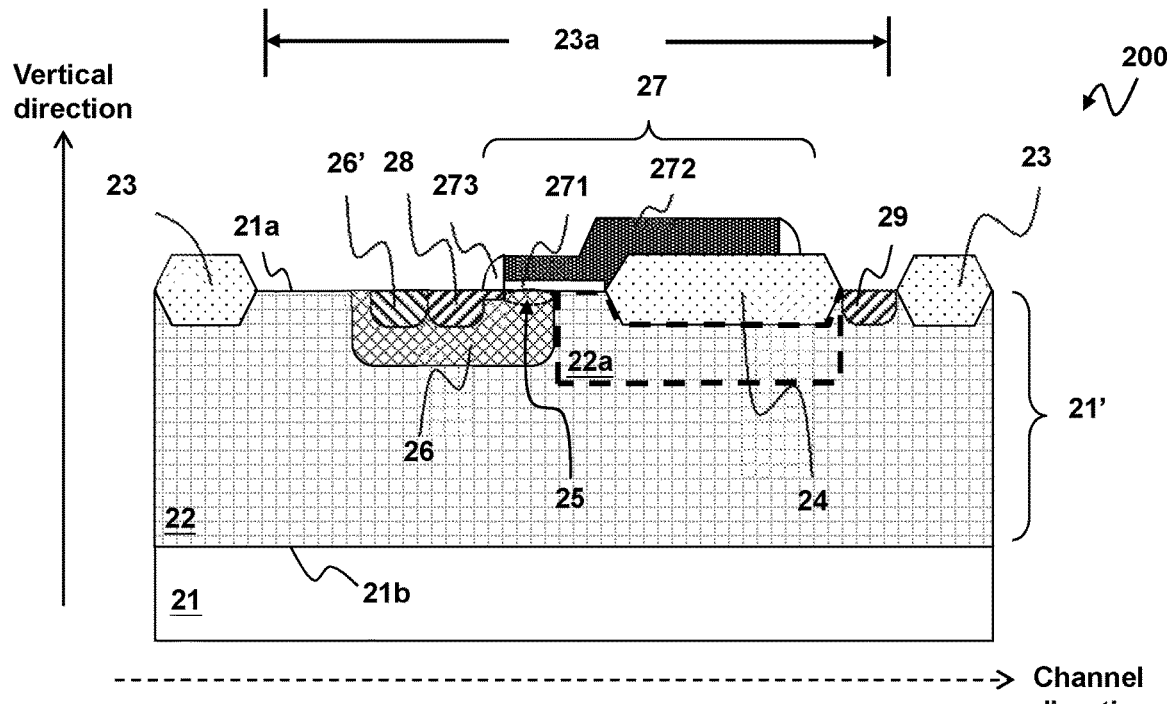
FIG. 2 shows a first embodiment of the present invention.

Please refer to FIG. 2, which shows a first embodiment of the present invention. FIG. 2 shows a schematic diagram of a cross-section view of a high voltage device 200. As shown in FIG. 2, the high voltage device 200 includes a crystalline silicon layer 21', a well 22, an isolation structure 23, a drift oxide region 24, a body region 26, a body contact 26', a gate 27, a source 28 and a drain 29.

The crystalline silicon layer 21' is formed on a semiconductor substrate 21 and the crystalline silicon layer 21' has a top surface 21a and a bottom surface 21b that is opposite to the top surface 21a in the vertical direction (as indicated by the direction of the solid arrow in FIG. 2). The semiconductor substrate 21 can be, for example but not limited to, a P-type conductivity type silicon substrate. The crystalline silicon layer 21', for example, is formed on the semiconductor substrate 21 by an epitaxial growth process step, or, a part of the semiconductor substrate 21 is used as the crystalline silicon layer 21'. The crystalline silicon layer 21' can be formed by any method known to a person having ordinary skill in the art, so the details thereof are not redundantly explained here.

Still referring to FIG. 2, the isolation structure 23 is formed on the top surface 21a and in contact with the top surface 21a, for defining a device region 23a. The isolation structure 23 is not limited to the local oxidation of silicon (LOCOS) structure as shown in FIG. 2; for example, it may be a shallow trench isolation (STI) structure instead. The device region 23a is an active region of the operation of the high voltage device 200. The drift oxide region 24 is formed on the top surface 21a and in contact with the top surface 21a, and the drift oxide region 24 is located on the drift region 22a (as indicated by the dashed frame shown in FIG. 2) within the device region 23a, and is in contact with the drift region 22a. At least a part of the drift oxide region 24 is located below and in contact with a part of the gate 27. The drift oxide region 24 can include, for example but not limited to, a local oxidation of silicon (LOCOS) structure, a shallow trench isolation (STI) structure or a chemical vapor deposition (CVD) oxide structure.

The well 22 having an N-type conductivity type is formed in the crystalline silicon layer 21'. The well 22 is located below the top surface 21a and in contact with the top surface 21a in the vertical direction. The well 22 can be formed by, for example but not limited to, an ion implantation process step which implants N-type conductivity type impurities in the crystalline silicon layer 21' in the form of accelerated ions, to form the well 22.

The body region 26 having the P-type conductivity type is formed in the well 22 within the device region 23a, and is located below and in contact with the top surface 21a in the vertical direction. The body contact 26' having the P-type conductivity type is formed in the body region 26, and is located below and in contact with the top surface 21a in the vertical direction, wherein the body contact 26' serves as an electrical contact of the body region 26.

The gate 27 is formed on the top surface 21a of the crystalline silicon layer 21' within the device region 23a, wherein a part of the well 22 is located below and in contact with the gate 27 in the vertical direction. The gate 27 at least includes: a dielectric layer 271, a conductive layer 272, and a spacer layer 273. The dielectric layer 271 is formed on the top surface 21a and in contact with the top surface 21a, and is in contact with the well 22 in the vertical direction. The conductive layer 272 is formed on the dielectric layer 271 and in contact with the dielectric layer 271, to serve as an electrical contact of the gate 27. The spacer layer 273 is formed outside of two sidewalls of the conductive layer 272, to serve as an electrical insulation layer of the gate 27.

Still referring to FIG. 2, the source 28 and the drain 29 have the N-type conductivity type. The source 28 and the drain 29 are formed below the top surface 21a and in contact with the top surface 21a in the vertical direction within the device region 23a, and are located below and outside two sides of the gate 27 respectively. The source 28 is located in the body region 26, and the drain 29 is located in the well 22, at a location near the right side of the gate 27 (i.e., the side that is away from the body region 26). An inverse region 25 is defined in the body region 26 between the source 28 and the well 22 in a channel direction (indicated by a dashed arrow in FIG. 2), and is in contact with the top surface 21a, to serve as an inverse current channel in an ON operation of the high voltage device 200. A drift region 22a is defined in the well 22 between the body region 26 and the drain 29 in the channel direction, and is in contact with the top surface 21a, to serve as a drift current channel in the ON operation of the high voltage device 200.

Note that the term "inverse current channel" means thus. Taking this embodiment as an example, when the high voltage device 200 operates in ON operation due to the voltage applied to the gate 27, an inverse layer is formed below the gate 27, between the source 28 and the drift current channel, so that a conduction current flows through the region of the inverse layer, which is the inverse current channel known to a person having ordinary skill in the art, so the details thereof are not redundantly explained here.

Note that the term "drift current channel" means thus. Taking this embodiment as an example, the drift current channel refers to a region where the conduction current passes through in a drifting manner when the high-voltage device 200 operates in ON operation, which is known to a person having ordinary skill in the art, so the details thereof are not redundantly explained here.

Note that the top surface 21a as referred to does not mean a completely flat plane but refers to the surface of the crystalline silicon layer 21'. In the present embodiment, for example, a part of the top surface 21a where the drift oxide region 24 is in contact with has a recessed portion.

Note that the gate 27 includes a dielectric layer 271 in contact with the top surface 21a, a conductive layer 272 on the dielectric layer 271, and a spacer layer 273 having electrical insulation properties, which is known to a person having ordinary skill in the art, so the details thereof are not redundantly explained here.

Note that the above-mentioned "P-type conductivity type" and "N-type conductivity type" mean that impurities of corresponding conductivity types are doped in regions of the high voltage MOS device (for example but not limited to the aforementioned well, body region, source and drain, etc.), so that the regions have the corresponding P-type conductivity type or the corresponding N-type conductivity type.

In addition, the term "high voltage device" refers to a transistor device wherein a voltage applied to the drain thereof in normal operation is higher than a specific voltage, such as 5V. A lateral distance (i.e., a length of the drift region) between the body region 26 and the drain 29 of the high voltage device 200 is determined according to the required operation voltage during normal operation, so that the device can operate at or higher than the aforementioned specific voltage, which is known to a person having ordinary skill in the art, so the details thereof are not redundantly explained here.

In basic implementation of the present invention, the high voltage device 200 can include, for example but not limited to, the crystalline silicon layer 21', the well 22, the body region 26, the gate 27, the source 28 and the drain 29. However in one preferred embodiment, the high voltage device 200 can further include, for example but not limited to, the isolation structure 23, the drift oxide region 24 and the body contact 26'.

One technical feature of the present invention which is advantageous over the prior art is that, according to the present invention, taking the embodiment shown in FIG. 2 as an example, the inverse region 25 includes a germanium distribution region and a boron distribution region, and the two distribution regions overlap with each other. The germanium distribution region has a germanium atom concentration higher than $1*10^{13}$ atoms/cm$^2$ and the germanium distribution region is configured to restrict a diffusion area of the boron distribution region. In this embodiment, the steps for forming the body region 26 in the well 22 include, for example but not limited to: implanting the germanium atoms in the germanium distribution region via a first ion implantation process step, so that the germanium distribution region has an amorphous region; next, after the germanium atoms have been implanted in the germanium distribution region, implanting the boron atoms in a part of the well 22 which includes the germanium distribution region via a second ion implantation process step; and next, after the boron atoms have been implanted in the well 22, transforming the germanium distribution region to a crystalline region via a thermal annealing process step and forming the body region 26 and the inverse region 25 within the body region 26.

After the germanium atoms have been implanted in the germanium distribution region, because the germanium atom has a size greater than the silicon atom, the silicon atoms in crystalline form will be collided by the germanium atoms to become amorphous form. Subsequently, the boron atoms are implanted into the amorphous well 22 (which includes the germanium distribution region), and the amorphous body region 26 is transformed to a crystalline body region 26 (i.e., a re-crystallized body region 26) via a thermal annealing process step which for example can be the same thermal annealing process step adopted to form the spacer layer 273. Because of the existence of the germanium atoms, the re-crystallized silicon-germanium lattices, as compared to the silicon lattices without any germanium atoms, can achieve much better crystallization more rapidly. In other words, according to the present invention, because the body region 26 formed during the thermal annealing process step has less defects, as compared to the prior art where no implantation of the germanium atoms is carried out, the diffusion area of the boron atoms caused by the thermal annealing process step can be restricted, to better control the area of the inverse region 25.

Figure 1A:
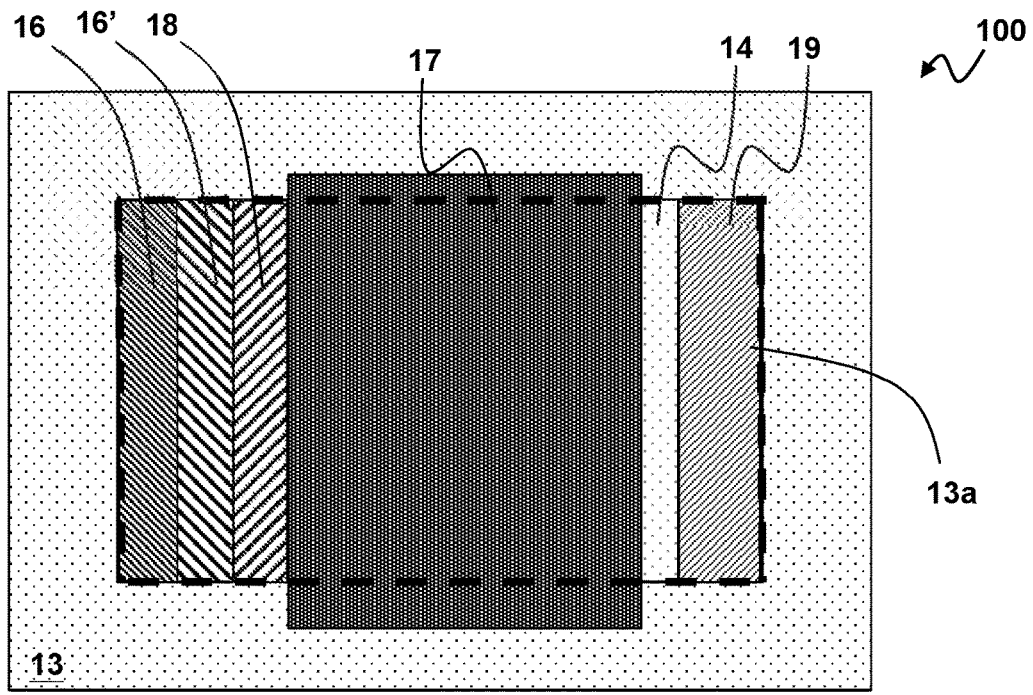
FIGS. 1A and 1B show a top view and a cross-section view of a conventional high voltage device 100, respectively.
Figure 1B:
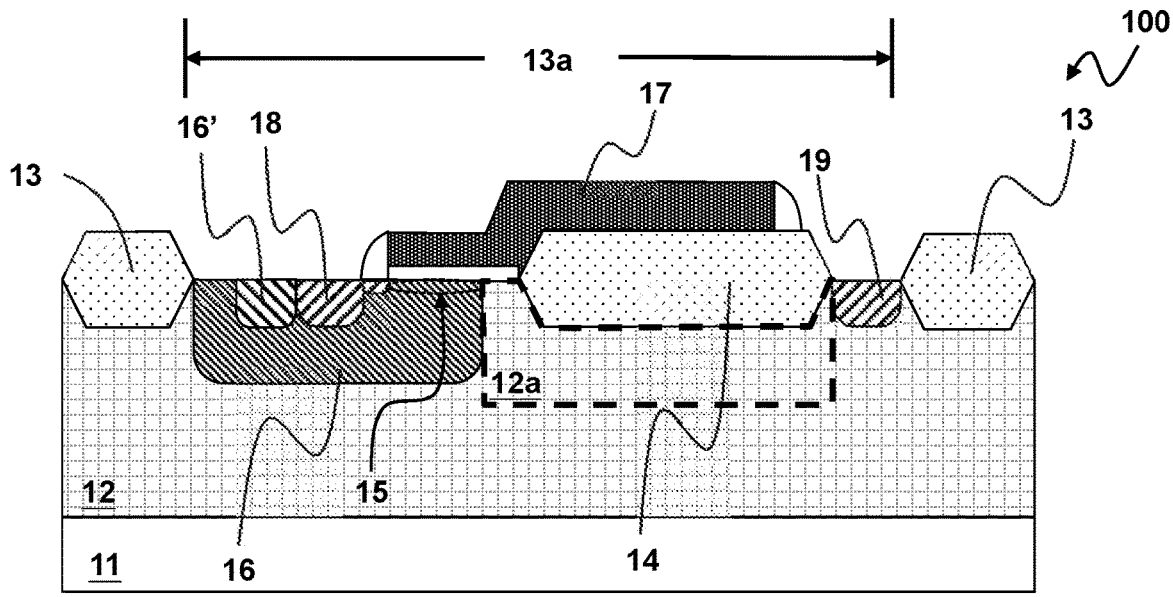

In the prior art, taking the high voltage device 100 shown in FIG. 1 as an example, although the silicon lattices of the prior art high voltage device 100 can be re-crystallized during the thermal annealing process step, because there is no existence of the germanium atoms, the recrystallization of the prior art high voltage device 100 is slower than the present invention. Generally, in the present invention, it takes simply several micro-seconds for the silicon-germanium lattices of the high voltage device to be re-crystallized to form perfect crystallization. In contrast, in the prior art, it requires several seconds for the silicon lattices of the high voltage device to be re-crystallized to form perfect crystallization. As a result, in the prior art, because it takes longer time for the recrystallization, during the thermal annealing process step, the boron atoms diffuse farther along the defects in the silicon lattices; consequently and undesirably, the inverse region 15 becomes larger, resulting in a longer inverse current channel which causes a higher on-resistance and a slower operation speed. The present invention can reduce the on-resistance of the high voltage device, thereby improving the operation speed of the high voltage device.

Figure 3:
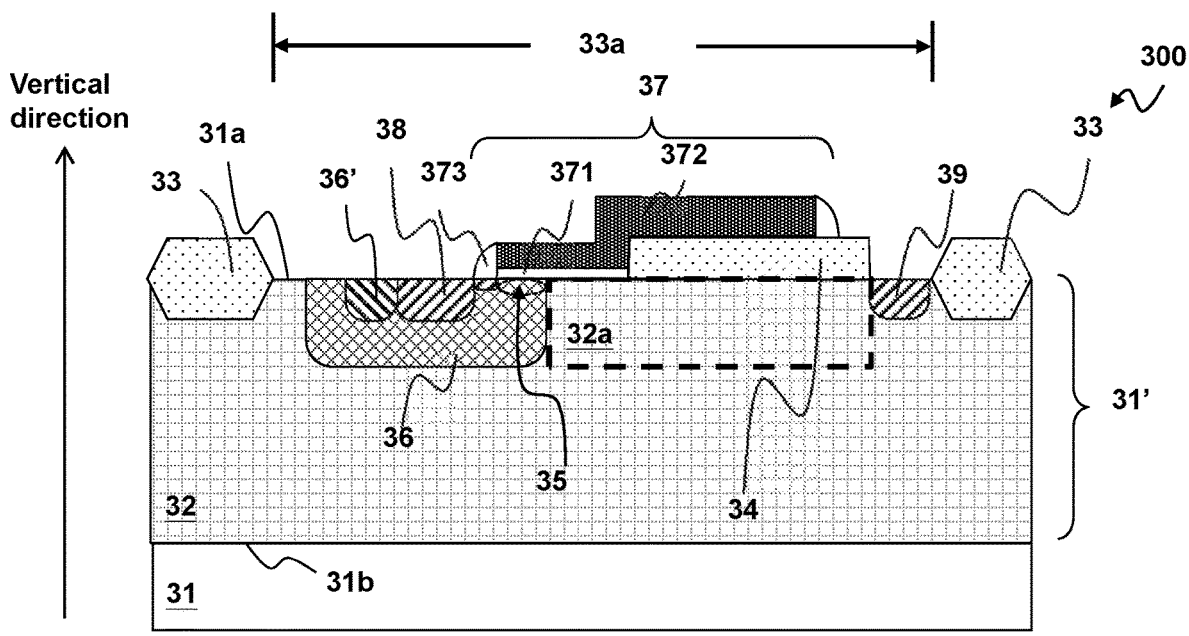
FIG. 3 shows a second embodiment of the present invention.

Please refer to FIG. 3, which shows a second embodiment of the present invention. FIG. 3 shows a schematic diagram of a cross-section view of a high voltage device 300. As shown in FIG. 3, the high voltage device 300 includes a crystalline silicon layer 31', a well 32, an isolation structure 33, a drift oxide region 34, a body region 36, a body contact 36', a gate 37, a source 38 and a drain 39.

The crystalline silicon layer 31' is formed on a semiconductor substrate 31 and the crystalline silicon layer 31' has a top surface 31a and a bottom surface 31b that is opposite to the top surface 31a in the vertical direction (as indicated by the direction of the solid arrow in FIG. 3). The semiconductor substrate 31 can be, for example but not limited to, a P-type conductivity type silicon substrate. The crystalline silicon layer 31', for example, is formed on the semiconductor substrate 31 by an epitaxial growth process step, or, a part of the semiconductor substrate 31 is used as the crystalline silicon layer 31'. The crystalline silicon layer 31' can be formed by any method known to a person having ordinary skill in the art, so the details thereof are not redundantly explained here.

Still referring to FIG. 3, the isolation structure 33 is formed on the top surface 31a and in contact with the top surface 31a, for defining a device region 33a. The isolation structure 33 is not limited to the local oxidation of silicon (LOCOS) structure as shown in FIG. 3; for example, it may be a shallow trench isolation (STI) structure instead. The device region 33a is an active region of the operation of the high voltage device 300. The drift oxide region 34 is formed on the top surface 31a and in contact with the top surface 31a, and the drift oxide region 34 is located on the drift region 32a (as indicated by the dashed frame shown in FIG. 3) within the device region 33a, and is in contact with the drift region 32a.

The well 32 having an N-type conductivity type is formed in the crystalline silicon layer 31'. The well 32 is located below the top surface 31a and in contact with the top surface 31a in the vertical direction. The well 32 can be formed by, for example but not limited to, an ion implantation process step which implants N-type conductivity type impurities in the crystalline silicon layer 31' in the form of accelerated ions, to form the well 32.

The body region 36 having the P-type conductivity type is formed in the well 32 within the device region 33a, and is located below and in contact with the top surface 31a in the vertical direction. The body contact 36' having the P-type conductivity type is formed in the body region 36, and is located below and in contact with the top surface 31a in the vertical direction, wherein the body contact 36' serves as an electrical contact of the body region 36.

The gate 37 is formed on the top surface 31a of the crystalline silicon layer 31' within the device region 33a, wherein a part of the well 32 is located below and in contact with the gate 37 in the vertical direction. The gate 37 at least includes: a dielectric layer 371, a conductive layer 372, and a spacer layer 373. The dielectric layer 371 is formed on the top surface 31a and in contact with the top surface 31a, and is in contact with the well 32 in the vertical direction. The conductive layer 372 is formed on the dielectric layer 371 and in contact with the dielectric layer 371, to serve as an electrical contact of the gate 37. The spacer layer 373 is formed outside of two sidewalls of the conductive layer 372, to serve as an electrical insulation layer of the gate 37.

Still referring to FIG. 3, the source 38 and the drain 39 have the N-type conductivity type. The source 38 and the drain 39 are formed below the top surface 31a and in contact with the top surface 31a in the vertical direction within the device region 33a, and are located below and outside two sides of the gate 37 respectively. The source 38 is located in the body region 36, and the drain 39 is located in the well 32, at a location near the right side of the gate 37 (i.e., the side that is away from the body region 36). An inverse region 35 is defined in the body region 36 between the source 38 and the well 32 in a channel direction (indicated by a dashed arrow in FIG. 3), and is in contact with the top surface 31a, to serve as an inverse current channel in an ON operation of the high voltage device 300. A drift region 32a is defined in the well 32 between the body region 36 and the drain 39 in the channel direction, and is in contact with the top surface 31a, to serve as a drift current channel in the ON operation of the high voltage device 300.

In the embodiment shown in FIG. 3, the inverse region 35 includes a germanium distribution region and a boron distribution region, and the two distribution regions overlap with each other. The germanium distribution region has a germanium atom concentration higher than $1*10^{13}$ atoms/$cm^2$ and the germanium distribution region is configured to restrict a diffusion area of the boron distribution region. In this embodiment, the steps for forming the body region 36 in the well 32 include, for example but not limited to, implanting the germanium atoms in the germanium distribution region via a first ion implantation process step, so that the germanium distribution region has an amorphous region; next, after the germanium atoms have been implanted in the germanium distribution region, implanting the boron atoms in a part of the well 32 which includes the germanium distribution region via a second ion implantation process step; and next, after the boron atoms have been implanted in the well 32, transforming the germanium distribution region to a crystalline region via a thermal annealing process step and forming the body region 36 and the inverse region 35 within the body region 36.

This embodiment differs from the first embodiment in that: the drift oxide region 24 of the first embodiment is a LOCOS structure, while the drift oxide region 34 of this embodiment is a chemical vapor deposition (CVD) oxide structure. The CVD oxide structure is formed by a CVD deposition process step. CVD deposition is well known to a person having ordinary skill in the art, so the details thereof are not redundantly explained here.

Figure 4:
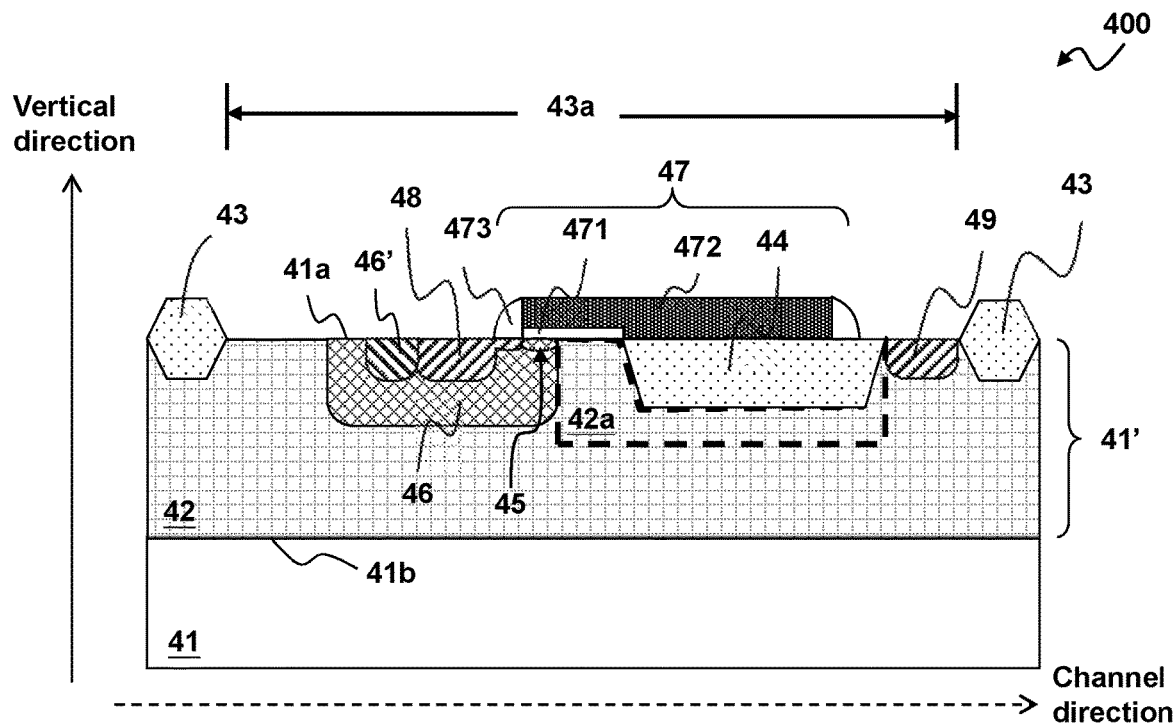
FIG. 4 shows a third embodiment of the present invention.

Please refer to FIG. 4, which shows a third embodiment of the present invention. FIG. 4 shows a schematic diagram of a cross-section view of a high voltage device 400. As shown in FIG. 4, the high voltage device 400 includes a crystalline silicon layer 41', a well 42, an isolation structure 43, a drift oxide region 44, a body region 46, a body contact 46', a gate 47, a source 48 and a drain 49.

The crystalline silicon layer 41' is formed on a semiconductor substrate 41 and the crystalline silicon layer 41' has a top surface 41a and a bottom surface 41b that is opposite to the top surface 41a in the vertical direction (as indicated by the direction of the solid arrow in FIG. 4). The semiconductor substrate 41 can be, for example but not limited to, a P-type conductivity type silicon substrate. The crystalline silicon layer 41', for example, is formed on the semiconductor substrate 41 by an epitaxial growth process step, or, a part of the semiconductor substrate 41 is used as the crystalline silicon layer 41'. The crystalline silicon layer 41' can be formed by any method known to a person having ordinary skill in the art, so the details thereof are not redundantly explained here.

Still referring to FIG. 4, the isolation structure 43 is formed on the top surface 41a and in contact with the top surface 41a, for defining a device region 43a. The isolation structure 43 is not limited to the local oxidation of silicon (LOCOS) structure as shown in FIG. 4; for example, it may be a shallow trench isolation (STI) structure instead. The device region 43a is an active region of the operation of the high voltage device 400. The drift oxide region 44 is formed on the top surface 31a and in contact with the top surface 41a, and the drift oxide region 44 is located on the drift region 42a (as indicated by the dashed frame shown in FIG. 4) within the device region 43a, and is in contact with the drift region 42a.

The well 42 having an N-type conductivity type is formed in the crystalline silicon layer 41'. The well 42 is located below the top surface 41a and in contact with the top surface 41a in the vertical direction. The well 42 can be formed by, for example but not limited to, an ion implantation process step which implants N-type conductivity type impurities in the crystalline silicon layer 41' in the form of accelerated ions, to form the well 42.

The body region 46 having the P-type conductivity type is formed in the well 42 within the device region 43a, and is located below and in contact with the top surface 41a in the vertical direction. The body contact 46' having the P-type conductivity type is formed in the body region 46, and is located below and in contact with the top surface 41a in the vertical direction, wherein the body contact 46' serves as an electrical contact of the body region 46.

The gate 47 is formed on the top surface 41a of the crystalline silicon layer 41' within the device region 43a, wherein a part of the well 42 is located below and in contact with the gate 47 in the vertical direction. The gate 47 at least includes: a dielectric layer 471, a conductive layer 472, and a spacer layer 473. The dielectric layer 471 is formed on the top surface 41a and in contact with the top surface 41a, and is in contact with the well 42 in the vertical direction. The conductive layer 472 is formed on the dielectric layer 471 and in contact with the dielectric layer 471, to serve as an electrical contact of the gate 47. The spacer layer 473 is formed outside of two sidewalls of the conductive layer 472, to serve as an electrical insulation layer of the gate 47.

Still referring to FIG. 4, the source 48 and the drain 49 have the N-type conductivity type. The source 48 and the drain 49 are formed below the top surface 41a and in contact with the top surface 41a in the vertical direction within the device region 43a, and are located below and outside two sides of the gate 47 respectively. The source 48 is located in the body region 46, and the drain 49 is located in the well 42, at a location near the right side of the gate 47 (i.e., the side that is away from the body region 46). An inverse region 45 is defined in the body region 46 between the source 48 and the well 42 in a channel direction (indicated by a dashed arrow in FIG. 4), and is in contact with the top surface 41a, to serve as an inverse current channel in an ON operation of the high voltage device 400. A drift region 42a is defined in the well 42 between the body region 46 and the drain 49 in the channel direction, and is in contact with the top surface 41a, to serve as a drift current channel in the ON operation of the high voltage device 400.

In the embodiment shown in FIG. 4, the inverse region 45 includes a germanium distribution region and a boron distribution region, and the two distribution regions overlap with each other. The germanium distribution region has a germanium atom concentration higher than $1*10^{13}$ atoms/$cm^2$ and the germanium distribution region is configured to restrict a diffusion area of the boron distribution region. In this embodiment, the steps for forming the body region 46 in the well 42 include, for example but not limited to, implanting the germanium atoms in the germanium distribution region via a first ion implantation process step, so that the germanium distribution region has an amorphous region; next, after the germanium atoms have been implanted in the germanium distribution region, implanting the boron atoms in a part of the well 42 which includes the germanium distribution region via a second ion implantation process step; and next, after the boron atoms have been implanted in the well 42, transforming the germanium distribution region to a crystalline region via a thermal annealing process step and forming the body region 46 and the inverse region 45 within the body region 46.

This embodiment differs from the first embodiment in that: the drift oxide region 24 of the first embodiment is a LOCOS structure, while the drift oxide region 44 of this embodiment is a shallow trench isolation (STI) structure. The STI structure is well known to a person having ordinary skill in the art, so the details thereof are not redundantly explained here.

Figure 5:
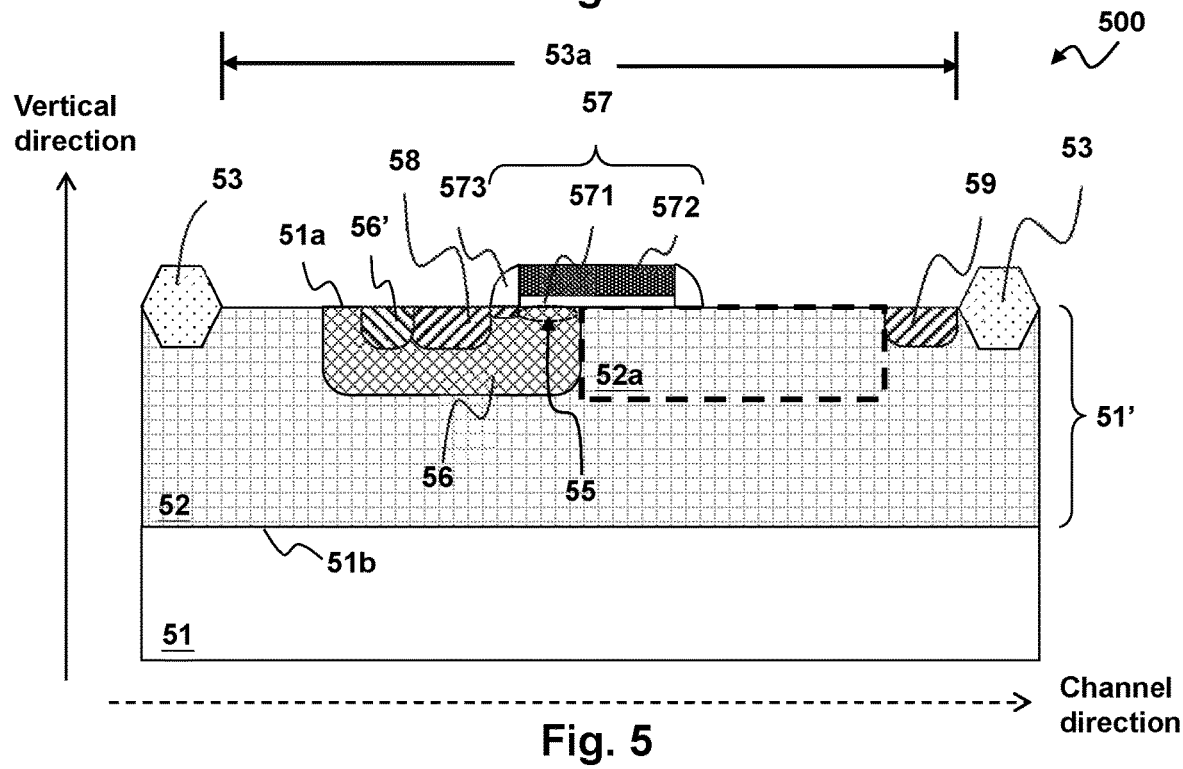
FIG. 5 shows a fourth embodiment of the present invention.

Please refer to FIG. 5, which shows a fourth embodiment of the present invention. FIG. 5 shows a schematic diagram of a cross-section view of a high voltage device 500. As shown in FIG. 5, the high voltage device 500 includes a crystalline silicon layer 51', a well 52, an isolation structure 53, a body region 56, a body contact 56', a gate 57, a source 58 and a drain 59.

The crystalline silicon layer 51' is formed on a semiconductor substrate 51 and the crystalline silicon layer 51' has a top surface 51a and a bottom surface 51b that is opposite to the top surface 51a in the vertical direction (as indicated by the direction of the solid arrow in FIG. 5). The semiconductor substrate 51 can be, for example but not limited to, a P-type conductivity type silicon substrate. The crystalline silicon layer 51', for example, is formed on the semiconductor substrate 51 by an epitaxial growth process step, or, a part of the semiconductor substrate 51 is used as the crystalline silicon layer 51'. The crystalline silicon layer 51' can be formed by any method known to a person having ordinary skill in the art, so the details thereof are not redundantly explained here.

Still referring to FIG. 5, the isolation structure 53 is formed on the top surface 51a and in contact with the top surface 51a, for defining a device region 53a. The isolation structure 43 is not limited to the local oxidation of silicon (LOCOS) structure as shown in FIG. 5; for example, it may be a shallow trench isolation (STI) structure instead. The device region 53a is an active region of the operation of the high voltage device 500.

The well 52 having an N-type conductivity type is formed in the crystalline silicon layer 51'. The well 52 is located below the top surface 51a and in contact with the top surface 51a in the vertical direction. The well 52 can be formed by, for example but not limited to, an ion implantation process step which implants N-type conductivity type impurities in the crystalline silicon layer 51' in the form of accelerated ions, to form the well 52.

The body region 56 having the P-type conductivity type is formed in the well 52 within the device region 53a, and is located below and in contact with the top surface 51a in the vertical direction. The body contact 56' having the P-type conductivity type is formed in the body region 56, and is located below and in contact with the top surface 51a in the vertical direction, wherein the body contact 56' serves as an electrical contact of the body region 56.

The gate 57 is formed on the top surface 51a of the crystalline silicon layer 51' within the device region 53a, wherein a part of the well 52 is located below and in contact with the gate 57 in the vertical direction. The gate 57 at least includes: a dielectric layer 571, a conductive layer 572, and a spacer layer 573. The dielectric layer 571 is formed on the top surface 51a and in contact with the top surface 51a, and is in contact with the well 52 in the vertical direction. The conductive layer 572 is formed on the dielectric layer 571 and in contact with the dielectric layer 571, to serve as an electrical contact of the gate 57. The spacer layer 573 is formed outside of two sidewalls of the conductive layer 572, to serve as an electrical insulation layer of the gate 57.

Still referring to FIG. 5, the source 58 and the drain 59 have the N-type conductivity type. The source 58 and the drain 59 are formed below the top surface 51a and in contact with the top surface 51a in the vertical direction within the device region 53a, and are located below and outside two sides of the gate 57 respectively. The source 58 is located in the body region 56, and the drain 59 is located in the well 52, at a location near the right side of the gate 57 (i.e., the side that is away from the body region 56). An inverse region 55 is defined in the body region 56 between the source 58 and the well 52 in a channel direction (indicated by a dashed arrow in FIG. 5), and is in contact with the top surface 51a, to serve as an inverse current channel in an ON operation of the high voltage device 500. A drift region 52a is defined in the well 52 between the body region 56 and the drain 59 in the channel direction, and is in contact with the top surface 51a, to serve as a drift current channel in the ON operation of the high voltage device 500.

In the embodiment shown in FIG. 5, the inverse region 55 includes a germanium distribution region and a boron distribution region, and the two distribution regions overlap with each other. The germanium distribution region has a germanium atom concentration higher than $1*10^{13}$ atoms/$cm^2$ and the germanium distribution region is configured to restrict a diffusion area of the boron distribution region. In this embodiment, the steps for forming the body region 56 in the well 52 include, for example but not limited to, implanting the germanium atoms in the germanium distribution region via a first ion implantation process step, so that the germanium distribution region has an amorphous region; next, after the germanium atoms have been implanted in the germanium distribution region, implanting the boron atoms in a part of the well 52 which includes the germanium distribution region via a second ion implantation process step; and next, after the boron atoms have been implanted in the well 52, transforming the germanium distribution region to a crystalline region via a thermal annealing process step and forming the body region 56 and the inverse region 55 within the body region 56.

This embodiment differs from the first embodiment in that: the drift oxide region 24 of the first embodiment is a LOCOS structure; however, the high voltage device 500 of this embodiment does not include any drift oxide region on the drift region 52a. The lateral distance (i.e., alength of the drift region 52a) between the body region 56 and the drain 59 of the high voltage device 500 is determined according to the operation voltage that the high voltage device is designed to operate with.

Figure 6A:
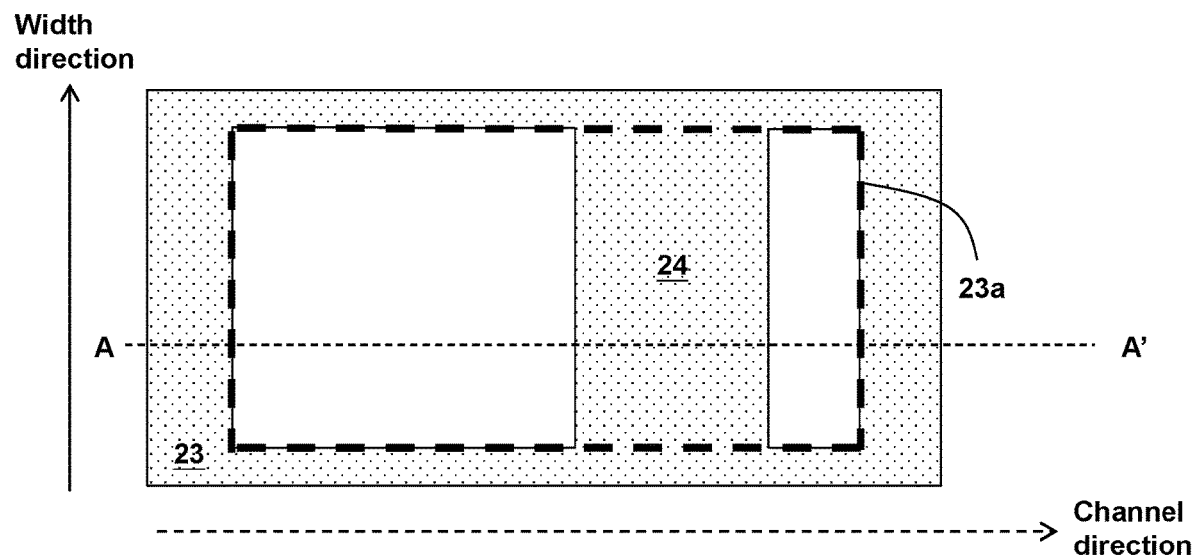
FIGS. 6A-6H show a fifth embodiment of the present invention.
Figure 6B:
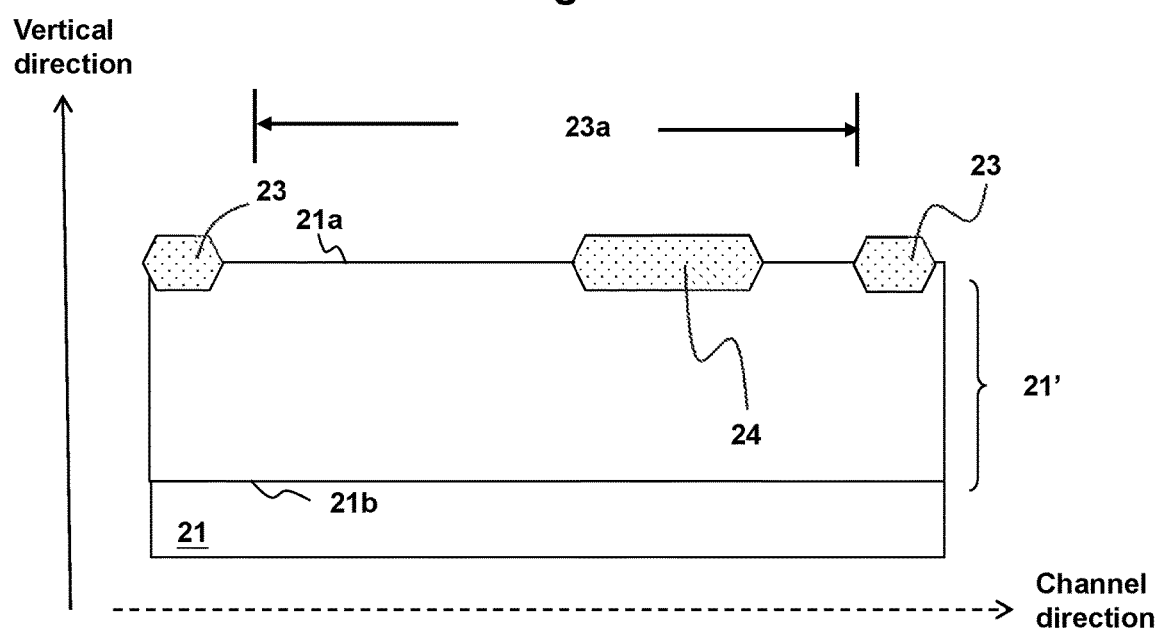

Please refer to FIGS. 6A to 6H, which show a fifth embodiment of the present invention. This embodiment shows schematic diagrams of a manufacturing method of the high voltage device 200 according to the present invention. FIG. 6B shows a schematic diagram of a cross-section view taken along the A-A' cross-section line shown in FIG. 6A. As shown in FIGS. 6A and 6B, first, a crystalline silicon layer 21' is formed on the semiconductor substrate 21, wherein the crystalline silicon layer 21' has a top surface 21a and a bottom surface 21b that is opposite to the top surface 21a in the vertical direction (as indicated by the direction of the solid arrow in FIG. 6B). The semiconductor substrate 21 is, for example but not limited to, a P-type conductivity type silicon semiconductor substrate. The crystalline silicon layer 21', for example, is formed on the semiconductor substrate 21 by an epitaxial growth process step, or a part of the semiconductor substrate 21 is used as the crystalline silicon layer 21'. The crystalline silicon layer 21' can be formed by any method known to a person having ordinary skill in the art, so the details thereof are not redundantly explained here.

Still referring to FIGS. 6A and 6B, next, an isolation structure 23 and a drift oxide region 24 are formed on and in contact with the top surface 21a. The isolation structure 23 is for defining the device region 23a (as indicated by a dashed frame shown in FIG. 6A). The isolation structure 23 is not limited to the local oxidation of silicon (LOCOS) structure as shown in the figure; for example, it may be a shallow trench isolation (STI) structure instead. The device region 23a is an active region of the operation of the high voltage device 200. The drift oxide region 24 is formed on the top surface 21a and in contact with the top surface 21a, and the drift oxide region 24 is located on the drift region 22a (as indicated by the dashed frame shown in FIG. 2) within the device region 23a, and is in contact with the drift region 22a.

Figure 6C:
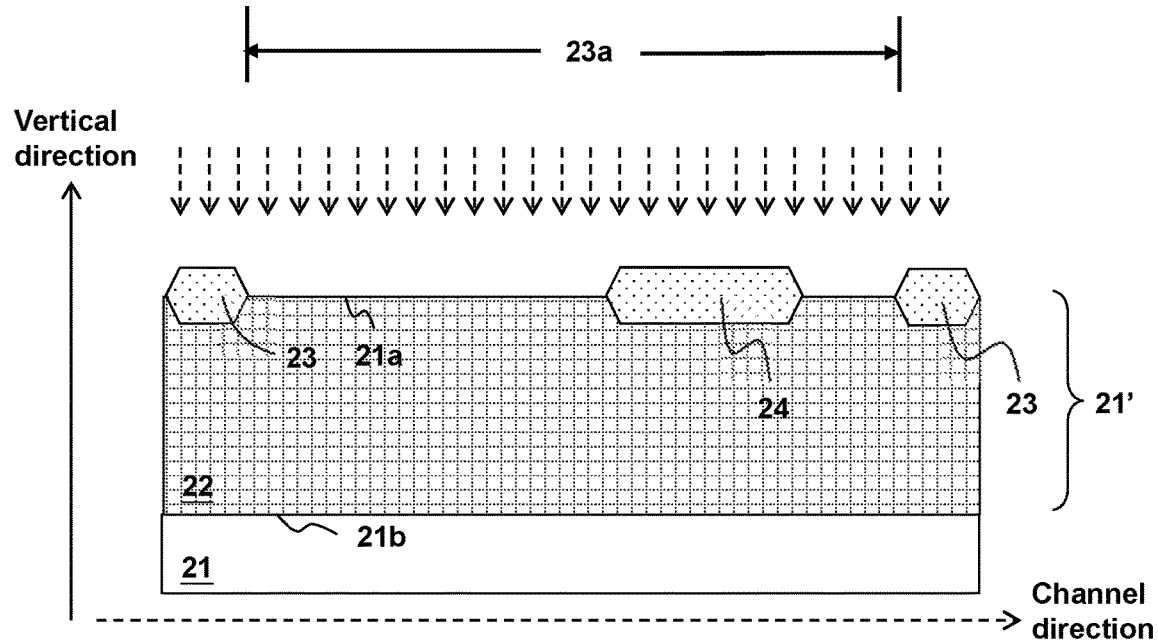

Next, referring to FIG. 6C, a well 22 having an N-type conductivity type is formed in the crystalline silicon layer 21'. The well 22 is located below the top surface 21a and in contact with the top surface 21a in the vertical direction. The well 22 can be formed by, for example but not limited to, an ion implantation process step which implants N-type conductivity type impurities in the crystalline silicon layer 21' in the form of accelerated ions as indicated by dashed arrows shown in FIG. 6C, to form the well 22.

Figure 6D:
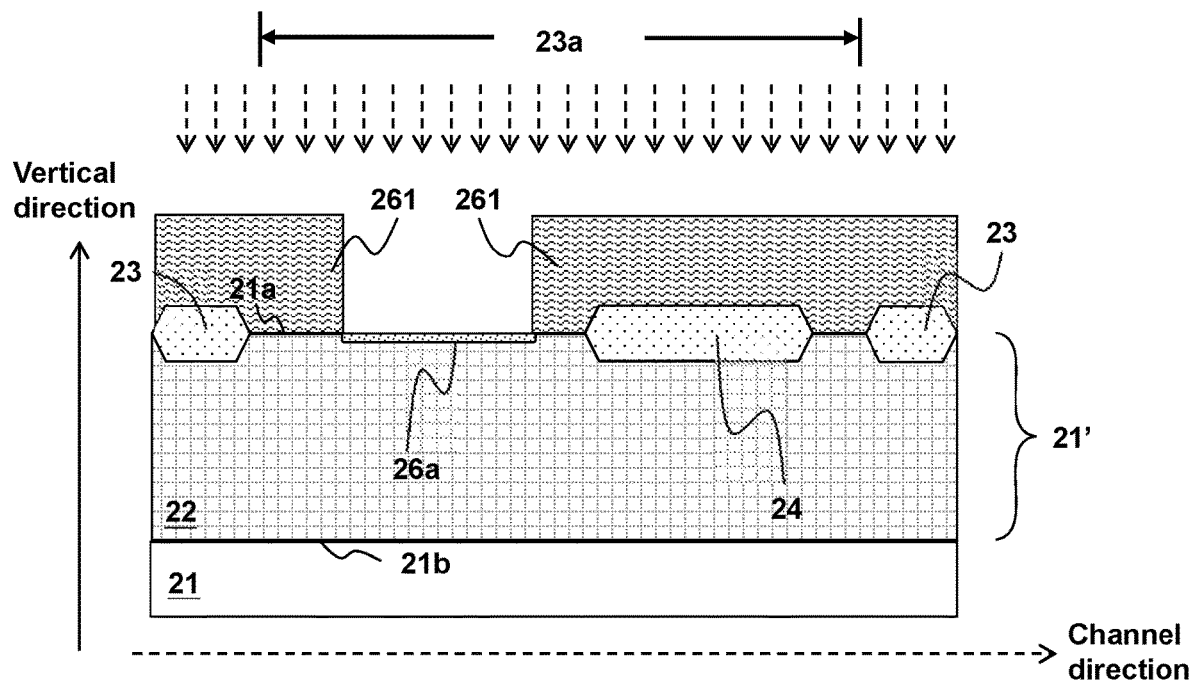

Next, referring to FIG. 6D, a photoresist layer 261 is formed as a mask via, for example but not limited to, a lithography process step. Next, the germanium atoms are implanted in a germanium distribution region 26a via a first ion implantation process step (as indicated by dashed arrows shown in FIG. 6D), so that the germanium distribution region 26a has an amorphous region. The thus formed germanium distribution region 26a has a germanium atom concentration higher than $1*10^{13}$ atoms/$cm^2$. In one embodiment, preferably, the germanium distribution region 26a has a depth smaller than, for example but not limited to, 0.1 micrometer. In one embodiment, more preferably, the range of the germanium distribution region 26a encompasses a range from the top surface 21a downward to a depth of 0.03 micrometer in the vertical direction.

Figure 6E:
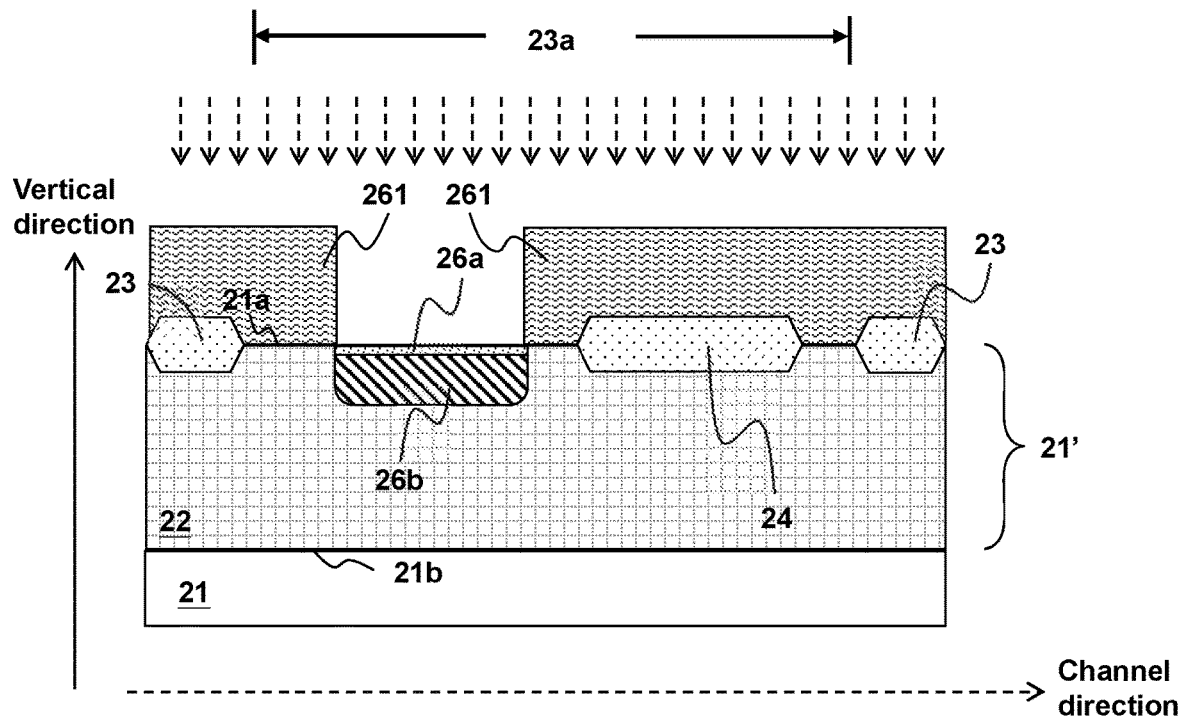

Next, referring to FIG. 6E, after the germanium atoms have been implanted in the germanium distribution region 26a, in one embodiment, the photoresist layer 261 is still used as a mask, and the boron atoms are implanted in a boron distribution region 26b in a part of the well 22 which includes the germanium distribution region 26a via a second ion implantation process step (as indicated by dashed arrows shown in FIG. 6E).

The inverse region 25 includes a germanium distribution region 26a and a boron distribution region 26b, and the two distribution regions overlap with each other. After the germanium and boron atoms have been implanted in the well 22, a thermal annealing process step is performed to transform the germanium distribution region 26a to a crystalline region, and forming the body region 26 and the inverse region 25 within the body region 26.

Figure 6F:
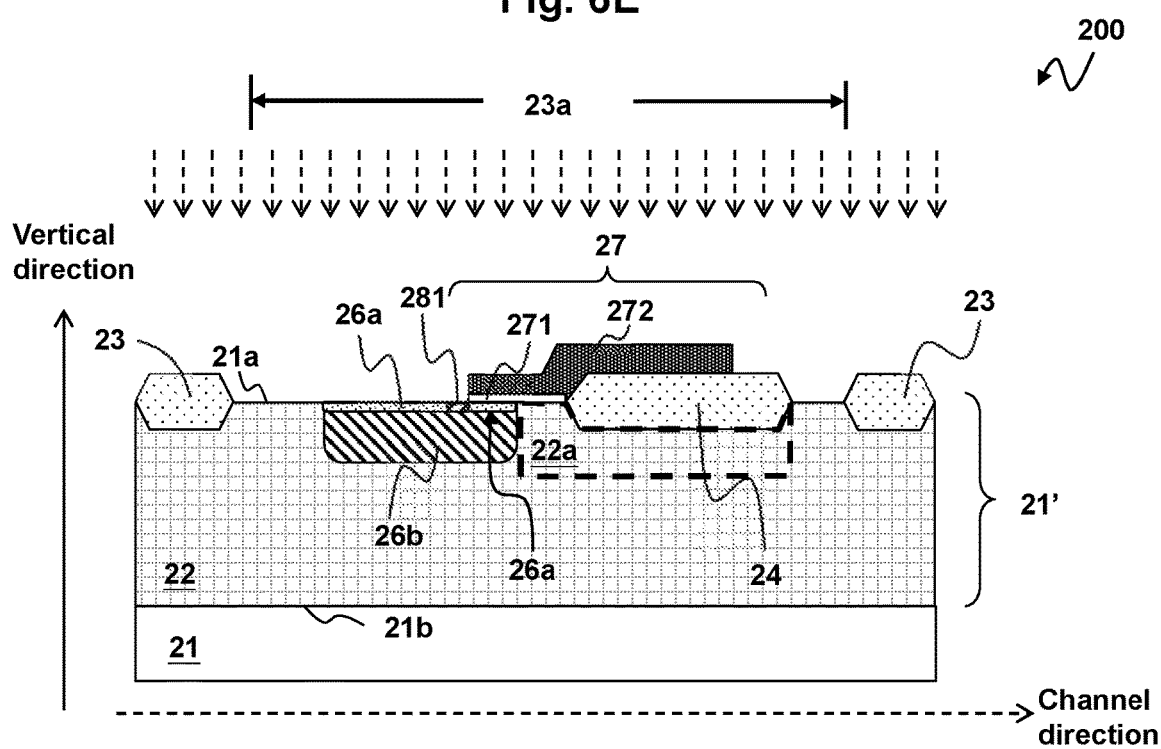

Next, referring to FIG. 6F, a dielectric layer 271 and a conductive layer 272 of the gate 27 is formed on the top surface 21a of the crystalline silicon layer 21' within the device region 23a, wherein a part of the body region 26 is located below and in contact with the gate 27 in the vertical direction, to serve as the inverse current channel in the ON operation of the high voltage device 200.

Next, still referring to FIG. 6F, in one embodiment, a lightly doped region 281 is formed after the dielectric layer 271 and the conductive layer 272 of the gate 27 are formed, wherein the lightly doped region 281 is for forming a current flowing channel right below the spacer layer 273, to ensure that the inverse current channel can be formed in the ON operation of the device. The lightly doped region 281 can be formed by, by for example but not limited to, an ion implantation process step which implants N-type conductivity type impurities into the body region 26 in the form of accelerated ions as indicated by dashed arrows shown in FIG. 6F, to form the lightly doped region 281.

Figure 6G:
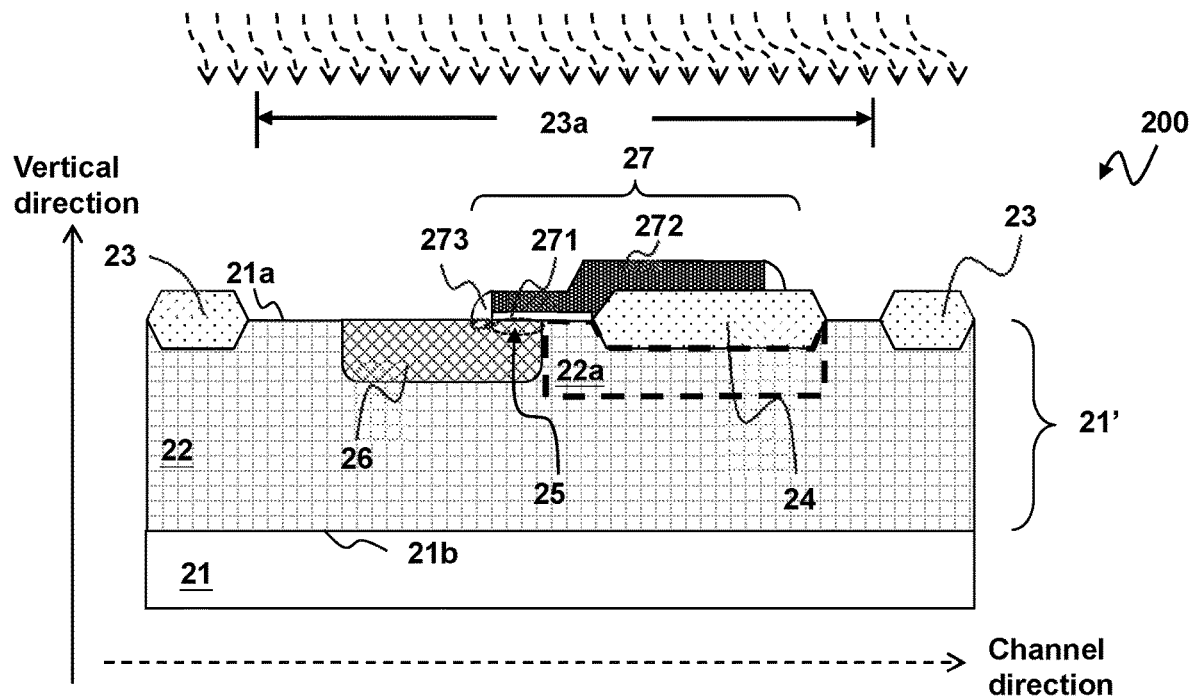

Next, referring to FIG. 6G, a spacer 273 is formed outside the sidewalls of the conductive layer 272, to form the gate 27. The step for forming the spacer 273 includes a thermal annealing process step. The germanium distribution region 26a is re-crystalized for example by this thermal annealing process step (as indicated by dashed curve arrows shown in FIG. 6G), to become a crystalline region and the body region 26 and the inverse region 25 within the body region 26 are formed at the same time.

Figure 6H:
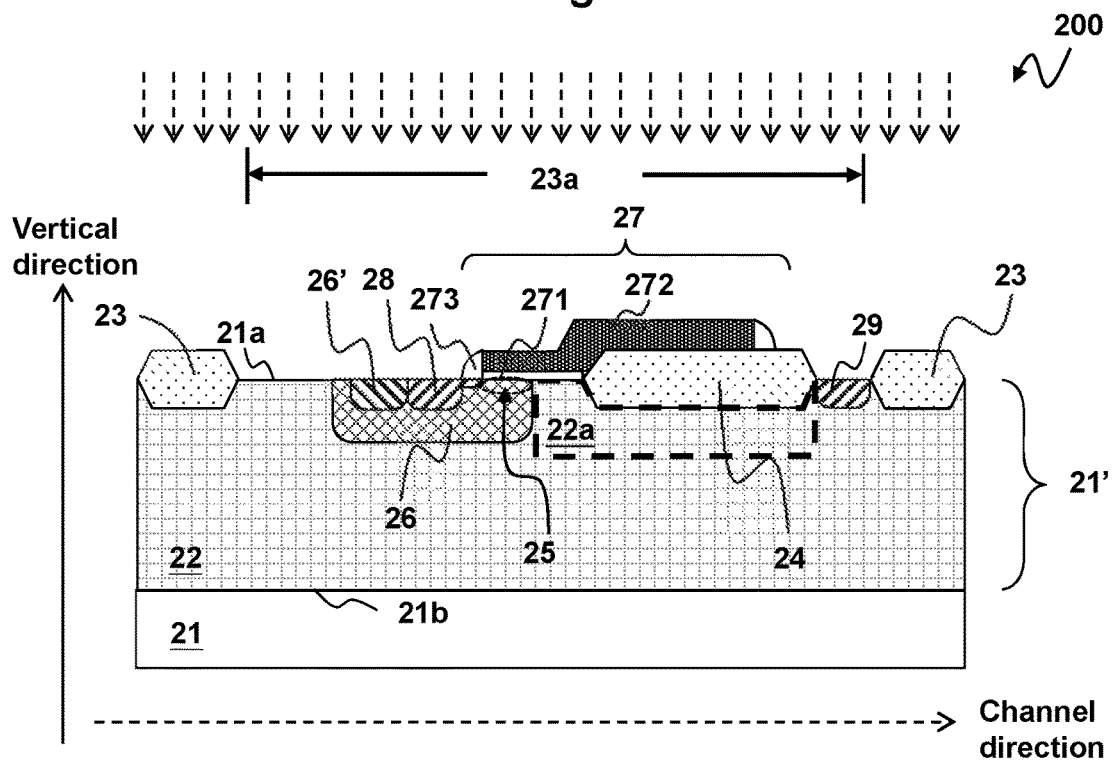

Next, referring to FIG. 6H, a body contact 26', a source 28 and a drain 29 are formed below and in contact with the top surface 21a in the device region 23a. The source 28 and the drain 29 are formed below the top surface 21a and in contact with the top surface 21a in the vertical direction within the device region 23a, and are located below and outside two sides of the gate 27 respectively. The source 28 is located in the body region 26, and the drain 29 is located in the well 22, at a location near the right side of the gate 27 (i.e., the side that is away from the body region 26). A drift region 22a is defined in the well 22 between the body region 26 and the drain 29 in the channel direction, and is in contact with the top surface 21a, to serve as a drift current channel in the ON operation of the high voltage device 200. The source 28 and the drain 29 have the N-type conductivity type. The source 28 and the drain 29 can be formed by, by for example but not limited to, a lithography process step and an ion implantation process step, wherein the lithography process step includes forming a photoresist layer as a mask, and the ion implantation process step implants the N-type conductivity type impurities into the body region 26 and the well 22 in the form of accelerated ions, respectively, to form the source 28 and the drain 29, respectively.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. The various embodiments described above are not limited to being used alone; two embodiments may be used in combination, or a part of one embodiment may be used in another embodiment. For example, other process steps or structures, such as a threshold voltage adjustment region, may be added. For another example, the lithography process step is not limited to the mask technology but it can also include electron beam lithography, immersion lithography, etc. Therefore, in the same spirit of the present invention, those skilled in the art can think of various equivalent variations and various combinations, and there are many combinations thereof, and the description will not be repeated here. The scope of the present invention should include what are defined in the claims and the equivalents.

What is claimed is:

1. A manufacturing method of a high voltage device, comprising:
    forming a crystalline silicon layer on a semiconductor substrate;
    forming a well in the crystalline silicon layer, wherein the well has an N-type conductivity type;
    forming a body region in the well, wherein the body region has a P-type conductivity type;
    forming a gate on and in contact with the well; and
    forming a source and a drain having the N-type conductivity type, wherein the source and the drain are located below, outside, and at different sides of the gate, and are located in the body region and the well, respectively;
    wherein an inverse region is defined in the body region, between the source and the well; the inverse region serving as an inverse current channel when the high voltage device is in an ON operation; wherein the inverse region includes a germanium distribution region which has a germanium atom concentration higher than $1*10^{13}$ atoms/cm$^2$;
    wherein a drift region is defined in the well, between the body region and the drain; the drift region serving as a drift current channel when the high voltage device is in the ON operation;
    wherein the inverse region further includes a boron distribution region; the germanium distribution region being configured to restrict a diffusion area of the boron distribution region;
    wherein the step of forming the body region in the well includes the steps of:
    implanting a plurality of germanium atoms in the germanium distribution region via a first ion implantation process step, so that the germanium distribution region has an amorphous region;
    after the plurality of germanium atoms have been implanted in the germanium distribution region, implanting a plurality of boron atoms via a second ion implantation process step, in a part of the well which includes the germanium distribution region; and
    after the plurality of boron atoms have been implanted in the well, transforming the germanium distribution region to a crystalline region via a thermal annealing process, and forming the body region and the inverse region within the body region.

2. The manufacturing method of the high voltage device of claim 1, further comprising:
    forming a drift oxide region on the drift region and in contact with the drift region; wherein at least a part of the drift oxide region is located below and in contact with a part of the gate; wherein the drift oxide region includes a local oxidation of silicon (LOCOS) structure, a shallow trench isolation (STI) structure, or a chemical vapor deposition (CVD) oxide structure.

3. The manufacturing method of the high voltage device of claim 1, further comprising:
    forming a body contact in the body region, wherein the body contact has the P-type conductivity type, wherein the body contact serves as an electrical contact of the body region.

4. The manufacturing method of the high voltage device of claim 1, wherein the gate includes:
    a dielectric layer, which is formed on and in contact with the well in a vertical direction;
    a conductive layer, which is formed on and in contact with the dielectric layer, and serves as an electrical contact of the gate; and
    a spacer layer, which is formed outside of two sidewalls of the conductive layer, and serves as an electrical insulation layer of the gate.

5. A manufacturing method of a high voltage device, comprising:
    forming a crystalline silicon layer on a semiconductor substrate;
    forming a well in the crystalline silicon layer, wherein the well has an N-type conductivity type;
    forming a body region in the well, wherein the body region has a P-type conductivity type;
    forming a gate on and in contact with the well; and
    forming a source and a drain having the N-type conductivity type, wherein the source and the drain are located below, outside, and at different sides of the gate, and are located in the body region and the well, respectively;
    wherein an inverse region is defined in the body region, between the source and the well; the inverse region serving as an inverse current channel when the high voltage device is in an ON operation; wherein the inverse region includes a germanium distribution region which has a germanium atom concentration higher than $1*10^{13}$ atoms/cm$^2$;

wherein a drift region is defined in the well, between the body region and the drain; the drift region serving as a drift current channel when the high voltage device is in the ON operation;

wherein the inverse region further includes a boron distribution region; the germanium distribution region being configured to restrict a diffusion area of the boron distribution region;

wherein the step of forming the body region in the well includes the steps of:

implanting a plurality of germanium atoms in the germanium distribution region via a first ion implantation process step, so that the germanium distribution region has an amorphous region;

after the plurality of germanium atoms have been implanted in the germanium distribution region, implanting a plurality of boron atoms via a second ion implantation process step, in a part of the well which includes the germanium distribution region; and after the plurality of boron atoms have been implanted in the well, transforming the germanium distribution region to a crystalline region via a thermal annealing process, and forming the body region and the inverse region within the body region;

wherein the amorphous region has a depth smaller than 0.1 micrometer.

6. The manufacturing method of the high voltage device of claim 5, further comprising:

forming a drift oxide region on the drift region and in contact with the drift region; wherein at least a part of the drift oxide region is located below and in contact with a part of the gate; wherein the drift oxide region includes a local oxidation of silicon (LOCOS) structure, a shallow trench isolation (STI) structure, or a chemical vapor deposition (CVD) oxide structure.

7. The manufacturing method of the high voltage device of claim 5, further comprising:

forming a body contact in the body region, wherein the body contact has the P-type conductivity type, wherein the body contact serves as an electrical contact of the body region.

8. The manufacturing method of the high voltage device of claim 5, wherein the gate includes:

a dielectric layer, which is formed on and in contact with the well in a vertical direction;

a conductive layer, which is formed on and in contact with the dielectric layer, and serves as an electrical contact of the gate; and a spacer layer, which is formed outside of two sidewalls of the conductive layer, and serves as an electrical insulation layer of the gate.

* * * * *